US006421249B1

United States Patent
Trombley et al.

(10) Patent No.: US 6,421,249 B1
(45) Date of Patent: Jul. 16, 2002

(54) ELECTRONIC DEVICE WITH AN ENHANCED ATTACHMENT TO SURFACE MOUNT LAMPS

(75) Inventors: Donald Milton Trombley, Flushing; Robert Ray Voltenburg, Jr.; David Brian Houser, both of Davison; Paul Dennis Scheller, Flushing, all of MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/690,390

(22) Filed: Oct. 18, 2000

(51) Int. Cl.[7] .............................. H05K 7/10; H05K 1/18; F21V 15/01
(52) U.S. Cl. ...................... 361/767; 361/761; 361/771; 439/230; 362/362; 362/365
(58) Field of Search ............ 257/79–103; 313/498–513; 361/748–783; 362/226, 249, 800, 459, 471, 487–489, 310, 255, 293, 439, 457, 373, 362, 365; 174/250–268; 439/226–244, 375

(56) References Cited

U.S. PATENT DOCUMENTS

| 4,781,960 A | * | 11/1988 | Wittes | 428/119 |
| 5,404,282 A | * | 4/1995 | Klinke | 362/249 |
| 6,252,350 B1 | * | 6/2001 | Alvarez | 313/498 |
| 6,270,236 B1 | * | 8/2001 | Brussong | 362/249 |

* cited by examiner

Primary Examiner—David Martin
Assistant Examiner—Michael L. Lindinger
(74) Attorney, Agent, or Firm—Jimmy L. Funke

(57) ABSTRACT

An electronic device having an enhanced attachment to a surface mount lamp (106) includes a circuit board (100), at least two conductive pads (102), at least two adhesive pads (104), and the surface mount lamp (106). The conductive pads (102) and the adhesive pads (104) are integrally formed within the circuit board (100). Preferably, each section of the circuit board (100) allotted for one surface mount lamp (106) has two conductive pads (102) and two adhesive pads arranged in a grid-like pattern such that similar pads are in opposing corners of the grid. The surface mount lamp (106) has two electrical leads (108), each protruding from opposing corners of a base (110) of the surface mount lamp (106). These electrical leads (108) are soldered to the conductive pads (102) in the circuit board (100). The unobscured opposing corners (112) of the plastic base (110) are partially melted and adhered to the adhesive pads (104) in the circuit board (100).

14 Claims, 1 Drawing Sheet

ELECTRONIC DEVICE WITH AN ENHANCED ATTACHMENT TO SURFACE MOUNT LAMPS

TECHNICAL FIELD

The present invention relates generally to electronic devices having surface mount lamps, and more particularly concerns circuit boards of the electronic devices using adhesive pads to secure the surface mount lamps to the circuit boards in automated assembly processing.

BACKGROUND OF THE INVENTION

Electronic devices employing surface mount lamps are most commonly required in instrument clusters of vehicles. Typically, these devices are used to communicate to a user. These devices include, for example, climate controls, audio systems, and instrument panels for the speedometer and tachometer. The surface mount lamps within these electronic devices are typically about 6 mm square in size and 10 mm in height.

Currently, surface mount lamps are attached to circuit boards by soldering electric leads of the surface mount lamps to conductive pads integrally formed within the circuit boards. Typically, a surface mount lamp has two electric leads on opposing corners of its square base. These leads are soldered to two conductive pads integrally formed within a circuit board. Unfortunately, this technique does not properly secure the lamps to the circuit boards during automated assembly processing. The torque associated with the height of a typical lamp can be excessive for only two pads to hold the lamp to the circuit board. Consequently, the lamps can rock back and forth and move off the pads or completely fall off the circuit boards prior to a reflow process. To resolve this problem, manufacturers are forced to install the lamps in the last machine in the assembly process. This sequence in the assembly process compromises optimal performance of the process. Further, other problems occur post-reflow whereupon the lamps become detached from the circuit boards during vibration testing. The soldering of the electric leads to the conductive pads is not stable enough to provide precise placement within tolerance requirements for accurate lighting. Such adverse effects are obviously undesirable.

Therefore, a need exists for an electronic device that eliminates movement of a surface mount lamp and detachment of a surface mount lamp from a circuit board during and after the automated assembly process.

SUMMARY OF THE INVENTION

It is an object of the present invention to provide an apparatus and a method for attaching a surface mount lamp to a circuit board of an electronic device such that the surface mount lamp does not deviate beyond design tolerances or completely fall off the circuit board during automated assembly processing.

In accordance with the above and other objects of the present invention, an electronic device having a circuit board and surface mount lamps attached thereto is provided. For each surface mount lamp, the electronic device includes at least two conductive pads and at least two adhesive pads. Typically, the surface mount lamp has two electric leads on opposing corners of its base that are soldered to two conductive pads integrally formed in the circuit board. Preferably, these pads are circular so as to provide for optimal part centering and best paste release from the stencils. The conductive pads are typically copper or copper with a solder coating. A common diameter for a conductive pad is about 3.5 mm.

The adhesive pads are integrally formed within the circuit board and are used to reinforce the connection between the surface mount lamp and the circuit board. In a preferred embodiment, two adhesive pads are used to provide a solder connection between the circuit board and opposing corners of the lamp base which are not occupied by the two electric leads. Preferably, the adhesive pads are circular in order to allow for best paste release from the stencils. Similar to the conductive pads, adhesive pads are typically copper or copper with a solder coating. A common diameter for an adhesive pad is about 3.0 mm.

Surface mount lamps are attached to circuit boards during the component placement and reflow processes. During the component placement process, the lamps are placed into position such that the conductive pads are in contact with the electric leads and the adhesive pads engage opposing corners of the plastic base. The attachment between the surface mount lamp and the circuit board is completed during the reflow process wherein the electric leads are soldered to the conductive pads and the opposing corners of the plastic base are melted to the adhesive pads to form a firm attachment. In an alternative embodiment, the adhesive pads have a solder coating such that the adhesive pads are soldered to the opposing corners of the plastic base during the reflow process.

Additional objects and features of the present invention will become apparent upon review of the drawings and accompanying detailed description of the preferred embodiments.

DETAILED DESCRIPTION OF THE PREFERRED EMBODIMENT

Figure 1:
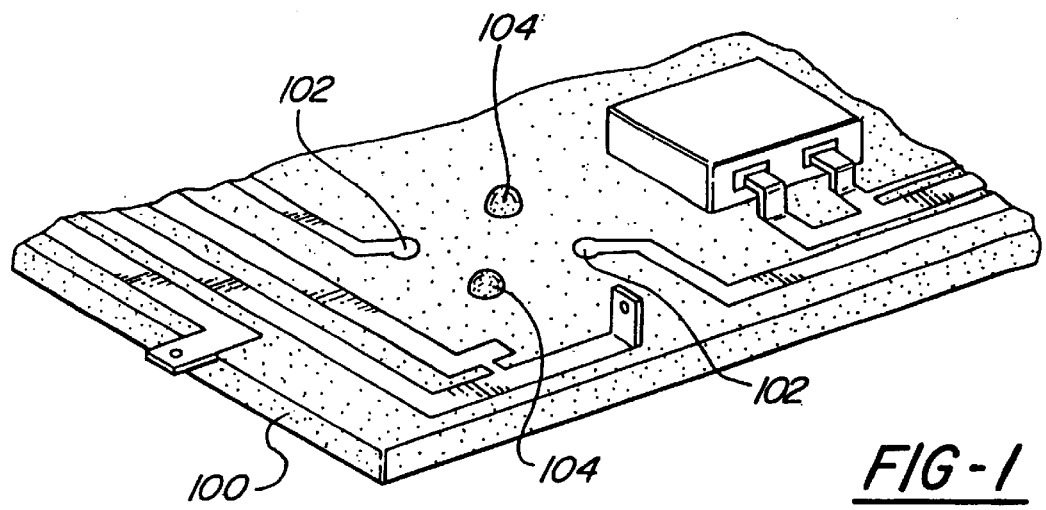
FIG. 1 is a top view of a section of a circuit board with adhesive pads integrally formed therein in accordance with a preferred embodiment of the present invention.

FIG. 1 illustrates a section of a circuit board 100 of an electronic device in accordance with a preferred embodiment of the present invention. This section of the circuit board 100 provides the location on the electronic device whereat the surface mount lamp is attached. The circuit board 100 has at least two conductive pads 102 and at least two adhesive pads 104 for each surface mount lamp adhered thereto. Preferably, a section of the circuit board 100 allotted for one surface mount lamp has two conductive pads 102 and two adhesive pads 104 arranged in a grid-like pattern such that similar types of pads are in opposing corners of the grid. Preferably, both types of pads are circular and made of copper or copper with a solder coating. The circular shape allows for an optimal part centering and best paste release from the stencils. A typical diameter of a conductive pad is about 3.5 mm, and a typical diameter of an adhesive pad is about 3.0 mm.

Figure 2:
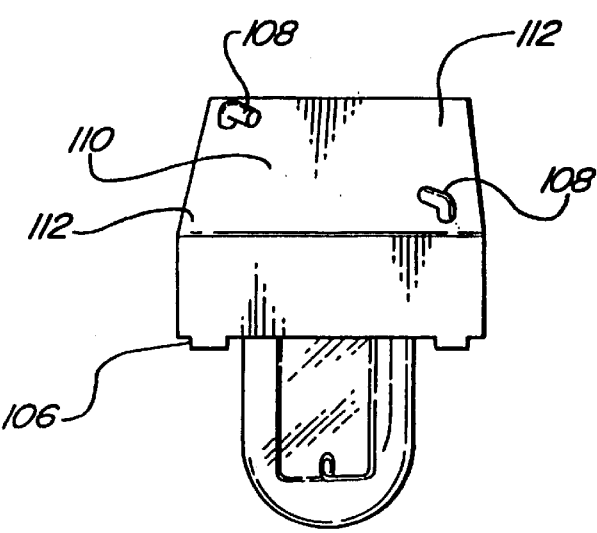
FIG. 2 is a bottom view of a surface mount lamp in accordance with a preferred embodiment of the present invention.

Turning now to FIG. 2, a bottom view of a surface mount lamp 106 illustrates two electrical leads 108 protruding from opposing corners of a base 110 of the surface mount lamp 106. The electrical leads 108 are soldered to the conductive pads 102 of the circuit board 100 in order to provide an electrical current to the surface mount lamp 106. Although the solder between the electrical leads 108 and the conductive pads 102 also provides a degree of mechanical cohesion between the surface mount lamp 106 and the circuit board 100, at least two adhesive pads 104 are required to properly secure the lamp 106 to the circuit board 100. The adhesive pads 104 reinforce the connection between the surface mount lamp 106 and the circuit board by adhering to unobscured opposing corners 112 of the base 110. In a preferred embodiment, the base 110 of the surface mount lamp 106 is made of a plastic material such that the adhesive pads 104 partially melt the unobscured opposing corners 112 of the base 110 in order to adhere the lamp 106 to the circuit board 100. These adhesive pads provide additional support to the lamp and prevent the lamp 106 from rocking back and forth.

Figure 3:
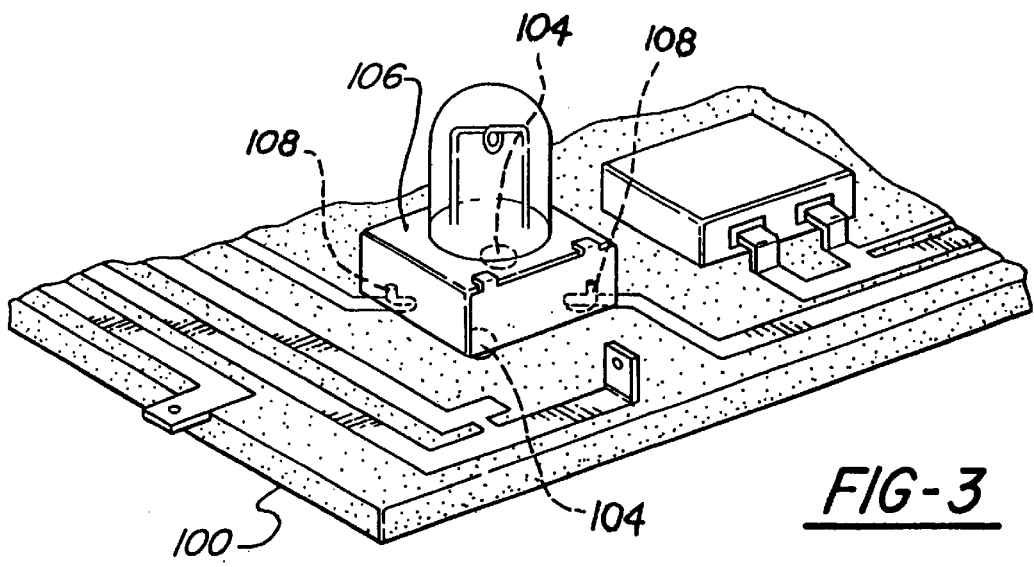
FIG. 3 is a perspective view of a section of a circuit board with a surface mount lamp secured thereto in accordance with a preferred embodiment of the present invention.

FIG. 3 is a perspective view of a section of the circuit board 100 with the surface mount lamp 106 attached thereto in accordance with the present invention. The use of adhesive pads 104 to affix the surface mount lamp 106 to the circuit board 100 substantially increases the stability of the connection between the circuit board 100 and the surface mount lamp 106 and reduces the possibility of the lamp 106 moving prior to a solder reflow process. Further, the use of adhesive pads substantially prevents the lamp from rocking back and forth and subsequently moving beyond design tolerances or completely falling off after the solder reflow process.

While the invention has been described in connection with one or more embodiments, it should be understood that the invention is not limited to those embodiments. On the contrary, the invention covers all alternatives, modifications, and equivalents, as may be included within the spirit and scope of the appended claims.

What is claimed is:

1. An electronic device comprising:
    a circuit board;
    at least two conductive pads integrally formed within said circuit board;
    at least two adhesive pads integrally formed within said circuit board; and
    a surface mount lamp attached to said circuit board by said at least two conductive pads and said at least two adhesive pads.

2. The electronic device of claim 1 wherein said surface mount lamp is enclosed within a plastic housing.

3. The electronic device of claim 2 wherein said plastic housing is adhered to said at least two adhesive pads integrally formed in said circuit board so as to attach said surface mount lamp to said circuit board.

4. The electronic device of claim 2 wherein said plastic housing is soldered to said at least two adhesive pads so as to attach said surface mount lamp to said circuit board.

5. The electronic device of claim 1 wherein said surface mount lamp has at least two electrical leads for contacting said at least two conductive pads integrally formed within said circuit board.

6. The electronic device of claim 1 wherein said at least two adhesive pads are circular.

7. The electronic device of claim 1 wherein said at least two adhesive pads are made of a copper material.

8. The electronic device of claim 1 wherein said at least two adhesive pads are made of a copper material with a solder coating.

9. The electronic device of claim 1 wherein said at least two conductive pads are circular.

10. The electronic device of claim 1 wherein said at least two conductive pads are made of a copper material.

11. The electronic device of claim 1 wherein said at least two conductive pads are made of a copper material with a solder coating.

12. The electronic device of claim 1 wherein said at least two adhesive pads and said at least two conductive pads are arranged to form a grid pattern in said circuit board.

13. The electronic device of claim 12 wherein said at least two adhesive pads are arranged diagonally in said grid pattern.

14. A method of attaching a surface mount lamp to an circuit board comprising the steps of:
    providing an circuit board with at least two adhesive pads and at least two conductive pads integrally formed therein;
    adhering a plastic housing of said surface mount lamp to said at least two adhesive pads;
    affixing at least two electrical leads to said at least two conductive pads.

* * * * *